(12) United States Patent
Fukuda

(10) Patent No.: US 7,224,608 B2
(45) Date of Patent: May 29, 2007

(54) SEMICONDUCTOR DEVICE

(75) Inventor: Koichi Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/246,164

(22) Filed: Oct. 11, 2005

(65) Prior Publication Data

US 2006/0092704 A1 May 4, 2006

(30) Foreign Application Priority Data

Oct. 14, 2004 (JP) ............................. 2004-300078

(51) Int. Cl.
*G11C 16/04* (2006.01)

(52) U.S. Cl. ........................... 365/185.18; 365/185.17; 365/189.05

(58) Field of Classification Search ........... 365/185.18, 365/185.17, 189.05
See application file for complete search history.

(56) References Cited

U.S. PATENT DOCUMENTS 6,331,950 B1 *  12/2001  Kuo et al. ............. 365/185.18

2005/0162214 A1   7/2005   Fukuda

FOREIGN PATENT DOCUMENTS

| JP | 5-64429 | 3/1993 |
|----|---------|--------|
| JP | 8-190798 | 7/1996 |
| JP | 2002-100967 | 4/2002 |
| JP | 2005-190533 | 7/2005 |

\* cited by examiner

*Primary Examiner*—David Lam
(74) *Attorney, Agent, or Firm*—Oblon, Spivak, McClelland, Maier & Neustadt, P.C.

(57) ABSTRACT

A semiconductor device includes an electrical circuit formed on a substrate; a level detector outputting a first level signal which has a signal level based on power supply voltage and which determines an operation of the electrical circuit; a command decoder decoding a command that is inputted from the outside, and outputting a command signal; a control circuit to which the command signal is inputted, the control circuit outputting a state signal expressing whether the electrical circuit is in an operation state; and a first latch circuit to which the first level signal and the state signal are inputted, the first latch circuit latching the first level signal at a time based on the state signal.

13 Claims, 9 Drawing Sheets

SEMICONDUCTOR DEVICE

CROSS-REFERENCE TO RELATED APPLICATIONS

This application is based upon and claims the benefit of priority from the prior Japanese Patent Applications No. 2004-300078, filed on Oct. 14, 2004, the entire contents of which are incorporated herein by reference.

BACKGROUND OF THE INVENTION

1. Field of the Invention

The present invention relates to a semiconductor device.

2. Background Art

There is nowadays a trend to lower, in steps, power supply voltages of semiconductor devices in order to reduce electric power consumption. In actuality, in these past 20 years, the power supply voltage has changed from 5 V to 3.3 V (or 2.5 V), and then from 3.3 V (or 2.5 V) to 1.8 V, except for semiconductor devices for special applications. Currently, the power supply voltage is in a transition period of shifting from 3.3 V (or 2.5 V) to 1.8 V. In a semiconductor device used in a portable device such as a cellular phone, the need to reduce the amount of electric power consumption is particularly strong, and it is predicted that the power supply voltage will decrease from 1.8 V to 1.5 V from hereon.

There are various technological problems in decreasing the power supply voltage. Accordingly, it is difficult to uniformly lower the power supply voltages for all semiconductor devices existing within a system. In the transition period of reducing the power supply voltage, a state arises in which the power supply voltages of some semiconductor devices are relatively low, whereas the power supply voltages of the remaining semiconductor devices are relatively high. In such a transition period of changing the power supply voltage, semiconductor devices corresponding with a dual range power supply voltage, or semiconductor devices corresponding with a wide range power supply voltage are needed.

In order to realize stable operation, the semiconductor device that corresponds with the dual range or wide range power supply voltage changes operation of a circuit, such as a booster or an input/output buffer circuit, according to a magnitude of an external power supply voltage. In many of such semiconductor devices, latching of the power supply voltage during operation of the semiconductor device is often carried out in order for the circuit operation to not become unstable even if the power supply voltage varies somewhat due to noise.

However, in the conventional semiconductor device, when fluctuations in the power supply voltage are relatively great such as a momentary service interruption, operations of the circuits such as the booster or the input/output buffer circuit are changed in the same way as at the time when the power supply voltage is changed. In particular, when the power supply voltage fluctuates momentarily, because a certain amount of time is needed in order to change the operations of these circuits, there are cases in which the circuit, such as the booster or the input/output buffer circuit, carries out operation corresponding to a low voltage range, regardless of the fact that the power supply voltage is actually at a high voltage range. In this case, within the circuit, such as the booster or the input/output buffer circuit, that uses the voltage obtained by boosting the power supply voltage, the power supply voltage of the high voltage range may be boosted by a boosting ability corresponding to the low voltage range. As a result, a voltage that is higher than supposed is generated within the circuit, such as the booster or the input/output buffer circuit, and the circuit may break.

In order to cope with such a problem, there is a technique of, after once latching the power supply voltage during operation of the semiconductor device, maintaining this latched state until the power source is turned off. However, in this technique, the power source must be turned off once in order to change the voltage range of the power supply voltage (see Japanese Patent Laid-Open No. 2003-429150).

There is therefore desired a semiconductor device that can smoothly change an operating state when the range of the power supply voltage is changed, while maintaining a stable operating state even if the power supply voltage varies due to noise or a momentary service interruption or the like during operation.

SUMMARY OF THE INVENTION

A semiconductor device according to an embodiment of the present invention comprises an electrical circuit formed on a substrate; a level detector outputting a first level signal which has a signal level based on power supply voltage and which determines an operation of the electrical circuit; a command decoder decoding a command that is inputted from the outside, and outputting a command signal; a control circuit to which the command signal is inputted, the control circuit outputting a state signal expressing whether the electrical circuit is in an operation state; and a first latch circuit to which the first level signal and the state signal are inputted, the first latch circuit latching the first level signal at a time based on the state signal.

DETAILED DESCRIPTION OF THE INVENTION

Hereafter, embodiments of the present invention will be described more specifically with reference to the drawings. Note that the invention is not limited by the embodiments.

(First Embodiment)

Figure 1:
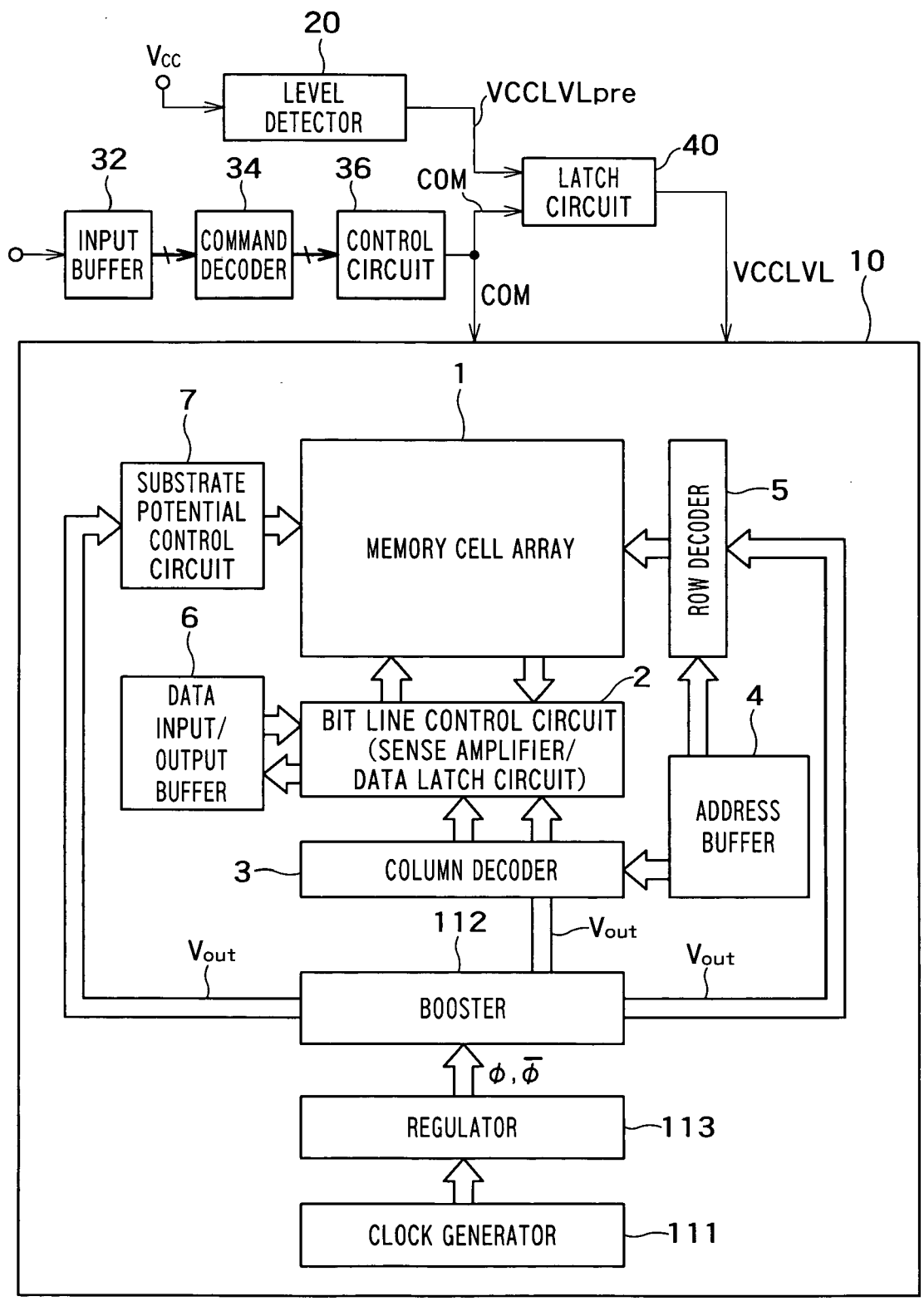
FIG. 1 is a block diagram of a semiconductor memory device 100 according to a first embodiment of the present invention.

FIG. 1 is a block diagram of a semiconductor memory device 100 according to a first embodiment of the present invention. In the present embodiment, the semiconductor memory device 100 is a non-volatile memory device corresponding with a dual range power supply voltage or a wide range power supply voltage, and is, for example, a NAND-type EEPROM, a NAND-type flash memory.

The semiconductor memory device 100 comprises a memory unit and peripheral circuits thereof 10. A bit line control circuit 2 is provided at the memory unit and the peripheral circuits thereof 10. The bit line control circuit 2 carries out writing and reading of data to and from a memory cell array 1. The bit line control circuit 2 is connected to a data input/output buffer 6. The bit line control circuit 2 receives, as input, output of a column decoder 3 that receives address signals from an address buffer 4. For the memory cell array 1, a row decoder 5 and a substrate potential control circuit 7 are provided. The row decoder 5 controls a control gate and a select gate. The substrate potential control circuit 7 controls potential of a p-type substrate (or a p-type well) on which the memory cell array 1 is formed, is provided.

The semiconductor memory device 100 has a clock generator 111, a regulator 113, and a booster 112. The booster 112 supplies various boosted voltages to the bit line control circuit 2, the row decoder 5, and the substrate potential control circuit 7. The boosted voltages are needed for operation at times of reading/writing/erasing data with respect to the memory cell array 1. The booster 112 can supply boosted voltage that is stabilized by the regulator 113.

Figure 2:
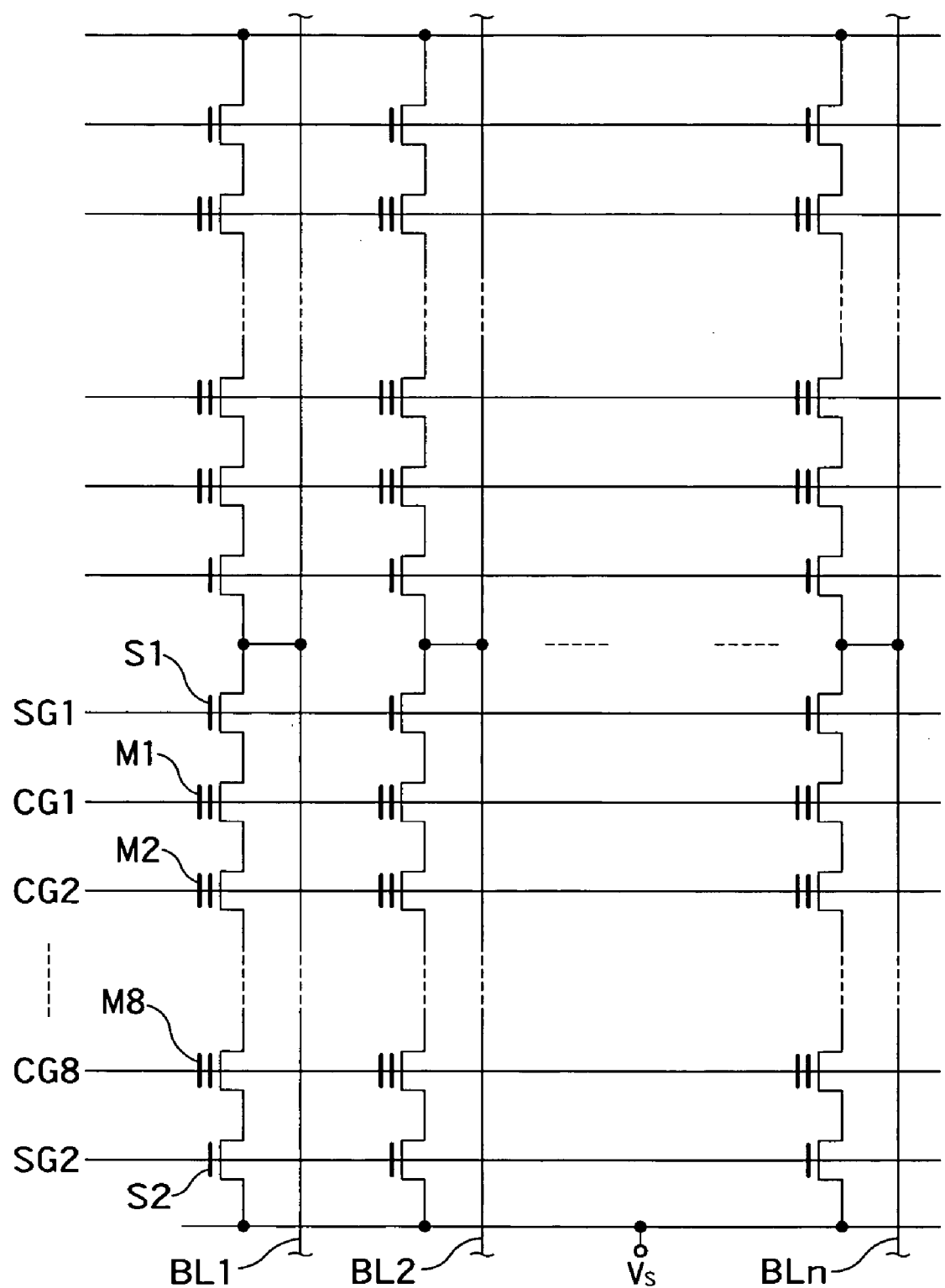
FIG. 2 is a circuit diagram of the memory cell array 1.

The memory cell array 1 may be structured as shown in FIG. 2, for example. This structure is a NAND-type flash memory disclosed in Japanese Patent Application No. H08-190798. The memory cell array 1 comprises memory cells M1 to M8 that are arranged in a matrix form, and is connected to bit lines BL1 to BLn via select transistor S1. Gates of the memory cells M1 to M8 and gates of the select transistors S1, S2 are connected respectively to word lines (also called control gate lines) CG1 to CG8 and a select gates SG1,SG2. The bit lines BL1 to BLn are connected to the bit line control circuit 2 shown in FIG. 1, and the column gate lines CG1 to CG8 are connected to the row decoder 5 shown in FIG. 1.

Figure 3:
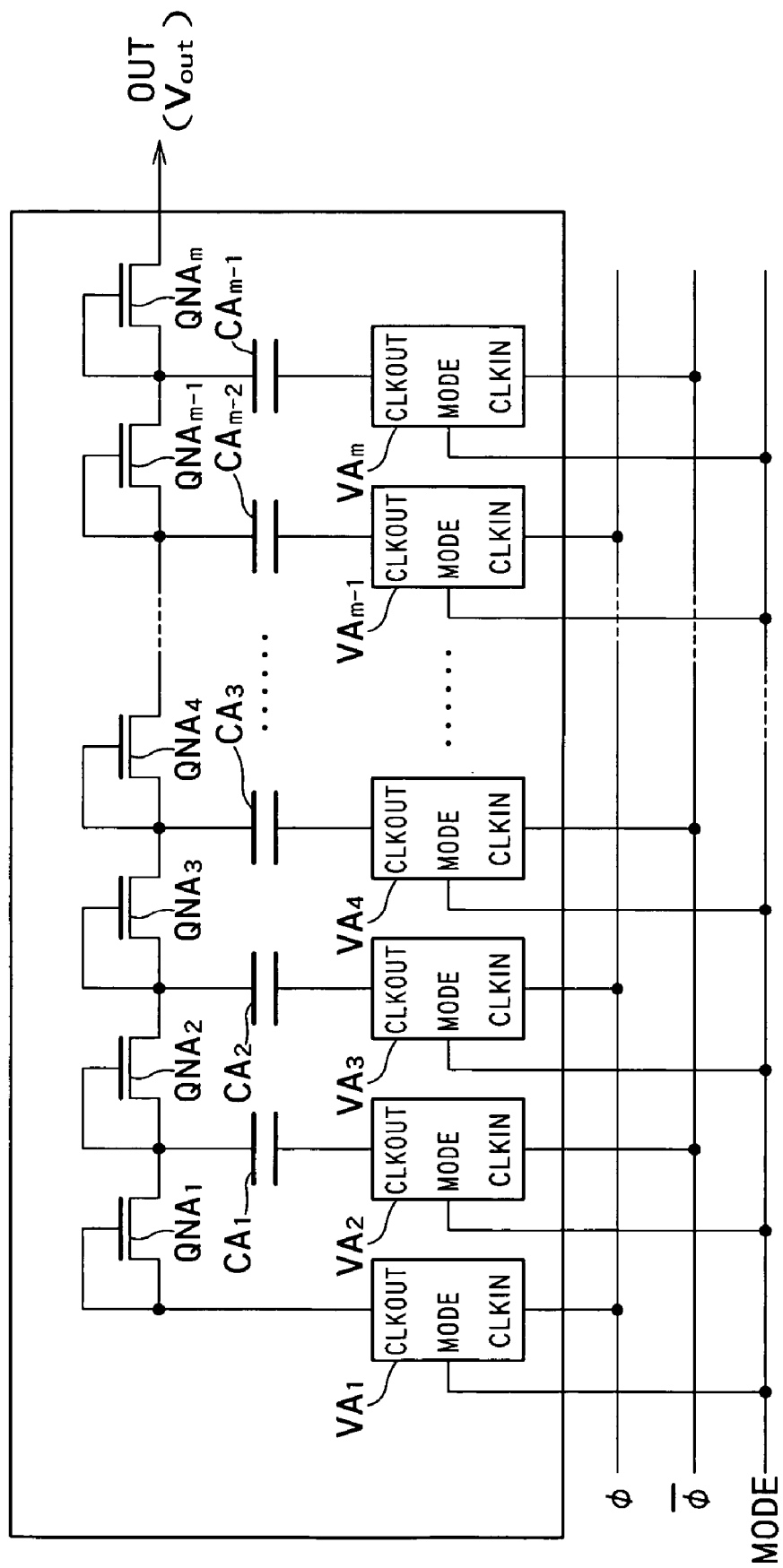
FIG. 3 is a circuit diagram of the booster 112.

The booster 112 may be structured as shown in FIG. 3, for example. This structure is a booster disclosed in Japanese Patent Application No. 2003-429150. The booster 112 receives supply of clocks Φ and Φ bar (Φ bar indicates the inverse signal of Φ) from the clock generator 111 of FIG. 1 via the regulator 113. Boosting operation is carried out by voltage converting circuits VA1 to VAm boosting the clocks Φ and Φ bar, and supplying the boosted clocks to transistor QNA1 and capacitors CA1 through CAm-1. Boosted voltage Vout is outputted from output OUT. As shown in FIG. 1, the output voltage Vout is supplied to the bit line control circuit 2, the row decoder 5, the substrate potential control circuit 7, and the like. A mode signal MODE of the booster 112 is a level signal VCCLVL outputted from a latch circuit 40 that will be described later. Clock boosting operations (boosting abilities) of the voltage converting circuits VA1 to VAm are changed according to a signal level of the level signal VCCLVL.

It suffices for the booster 112 and the memory cell array 1 to have similar functions. The booster 112 and the memory cell array 1 are not limited to these structures, and may be other structures.

Figure 4:
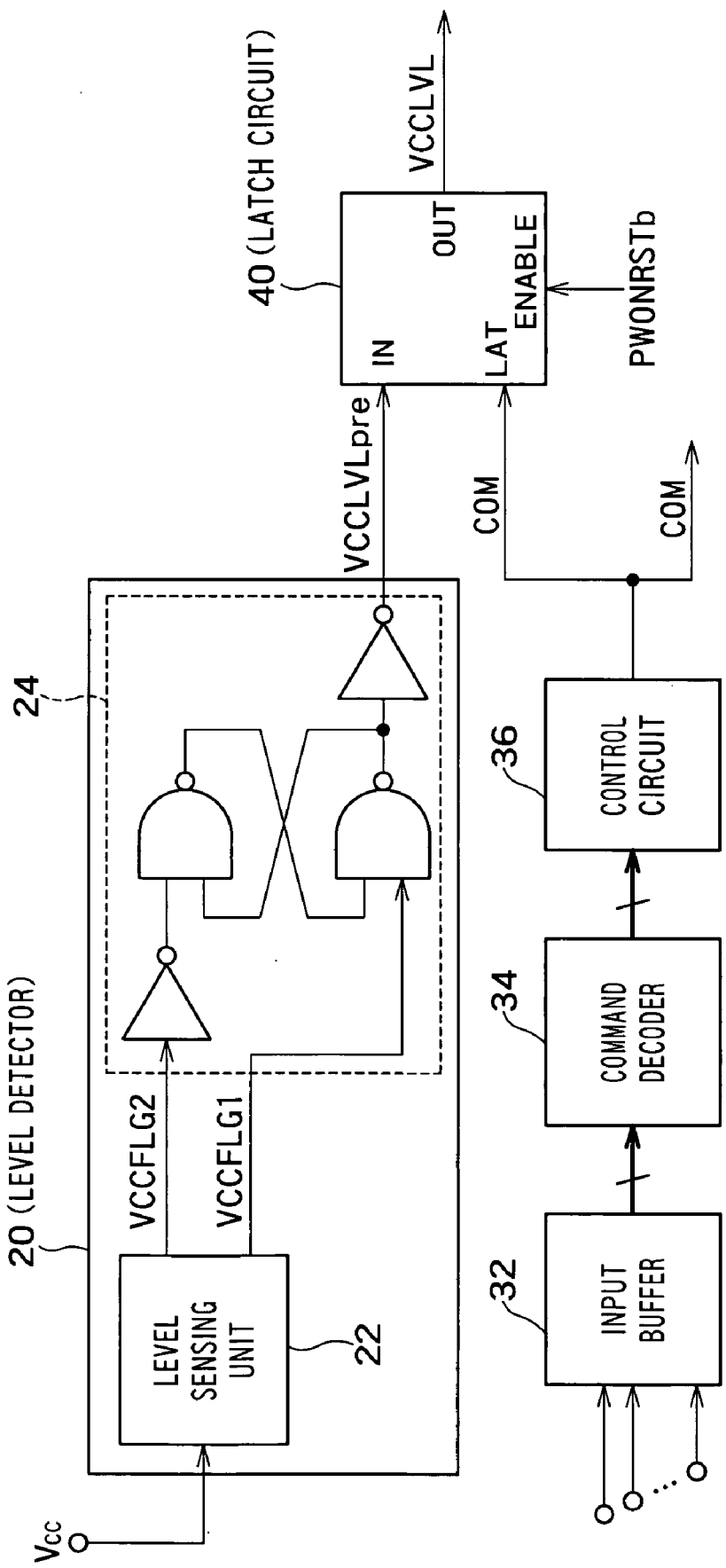
FIG. 4 is a structural diagram of the level sensing circuit 20, the input buffer 32, the command decoder 34, the control circuit 36, and the latch circuit 40.

The semiconductor memory device 100 further comprises a level detector 20, an input buffer 32, a command decoder 34, a control circuit 36, and the latch circuit 40. FIG. 4 is a structural diagram of the level sensing circuit 20, the input buffer 32, the command decoder 34, the control circuit 36, and the latch circuit 40. The level sensing circuit 20 includes a level sensing unit 22 and a latch unit 24. The level sensing unit 22 receives supply of power supply voltage Vcc from the exterior, and outputs flag signals VCCFLG1 and VCCFLG2 in accordance with the magnitude of the power supply voltage Vcc.

When the semiconductor memory device 100 is a device corresponding with a dual range power supply voltage, for example, the power supply voltage Vcc has 2.7 V to 3.6 V as the high voltage range, and has 1.65 V to 1.95 V as the low voltage range. In order to ensure operation of the semiconductor memory device 100 at this dual range power supply voltage Vcc, the level sensing unit 22 has threshold voltages in accordance with the respective voltage ranges. In order to prevent the voltage range from easily switching due to noise from an external power source, the level sensing circuit 20 has hysteresis in the switching between the high voltage range and the low voltage range, and the threshold voltages have certain margins according to specifications.

Figure 7:
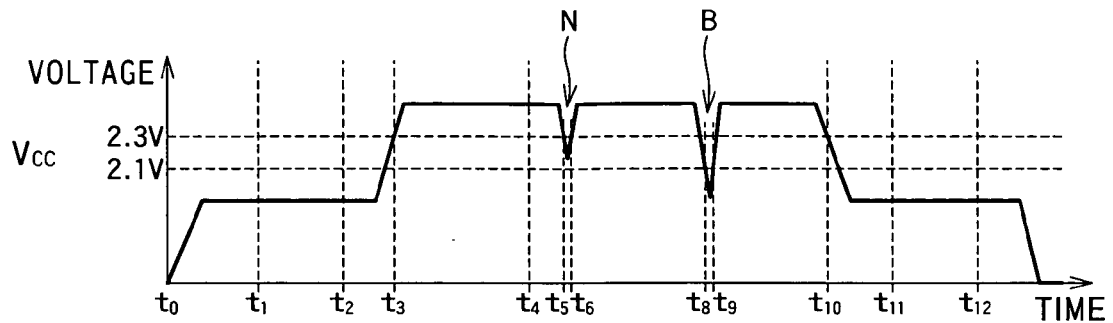
FIG. 7 is a timing chart of the power supply voltage Vcc.

As shown in FIG. 7, in the present embodiment, a first threshold voltage for the low voltage range is 2.1 V, and a second threshold voltage for the high voltage range is 2.3 V. Namely, when the power supply voltage Vcc is lower than 2.1 V, the semiconductor memory device 100 operates by a structure corresponding with the low voltage range. When the power supply voltage Vcc is higher than 2.3 V, the semiconductor memory device 100 operates by a structure corresponding with the high voltage range.

Figure 8:
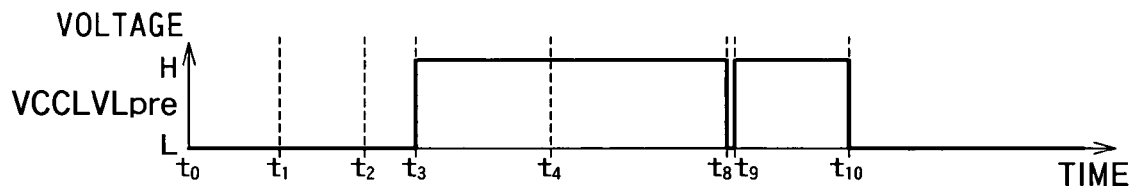
FIG. 8 is a timing chart of the level signal VCCLVLpre.

As shown in FIG. 8, when the power supply voltage Vcc is lower than the first threshold voltage (2.1 V), the level sensing unit 22 outputs low as the flag signals VCCFLG1 and VCCFLG2. The latch unit 24 thereby outputs low as a level signal VCCLVLpre.

When the power supply voltage Vcc is higher than the second threshold voltage (2.3 V), the level sensing unit 22 outputs high as the flag signals VCCFLG1 and VCCFLG2. The latch unit 24 thereby outputs high as the level signal VCCLVLpre.

When the power supply voltage Vcc is between the first threshold voltage and the second threshold voltage (2.1<Vcc<2.3 V), the flag signal VCCFLG1 is high, and VCCFLG2 is low. At this time, the latch unit 24 latches the state before then. Namely, when the power supply voltage Vcc rises from the low voltage range to between the first threshold voltage and the second threshold voltage, the latch unit 24 maintains low as the level signal VCCLVLpre, until the power supply voltage Vcc exceeds the second threshold voltage. When the power supply voltage Vcc decreases from the high voltage range to between the first threshold voltage and the second threshold voltage, the latch unit 24 maintains high as the level signal VCCLVLpre, until the power supply voltage Vcc is lower than the first threshold voltage.

The input buffer 32 receives a command from the exterior, which command determines operations of the memory unit and the peripheral circuits thereof 10, and the input buffer 32 stores the command. The command decoder 34 decodes the command, and generates a command signal. On the basis of the decoded command signal, the control circuit 36 outputs a state signal COM expressing that the semiconductor device 100 is in an operation BUSY state.

Figure 9:
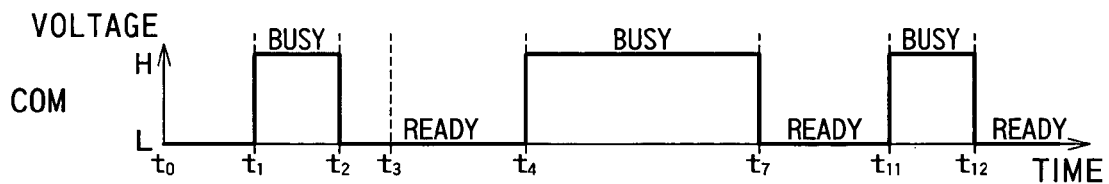
FIG. 9 is a timing chart of the state signal COM.

As shown in FIG. 9, the signal COM is high when the memory unit and the peripheral circuits thereof 10 are operating (BUSY), and is low when they are not operating and are in a state of waiting for receiving a command (READY). Conventionally, the state signal COM is outputted only to the memory unit and the peripheral circuits thereof 10. However, in the present embodiment, the state signal COM is outputted to the latch circuit 40 as well.

The level signal VCCLVLpre and the state signal COM are inputted to the latch circuit 40. The latch circuit 40 latches the signal level of the level signal VCCLVLpre immediately after the state signal COM becomes high (BUSY). Namely, on the basis of the time when the command signal COM rises to high (t1, t4, and t11 in FIG. 9), the latch circuit 40 latches the signal level of the level signal VCCLVLpre, and outputs this signal level as level signal VCCLVL. The structure of the latch circuit 40 is not particularly limited, and may be the structure shown in FIG. 5 or FIG. 6.

Figure 10:
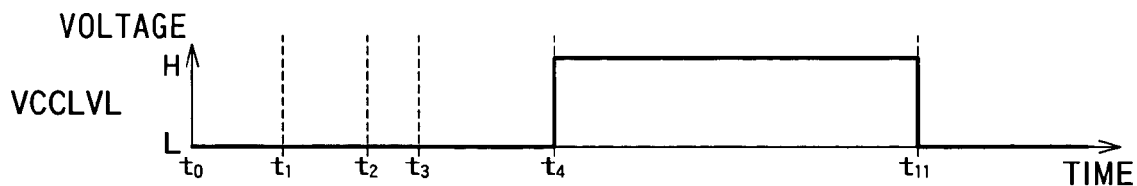
FIG. 10 is a timing chart of the level signal VCCLVL.

For example, as shown in FIG. 10, during the time period when the power supply voltage Vcc is lower than the first threshold voltage, when the state signal COM becomes high (BUSY), the latch circuit 40 latches the low-level level signal VCCLVLpre, and outputs this low level as the level signal VCCLVL. During the time period when the power supply voltage Vcc is higher than the second threshold voltage, when the state signal COM becomes high (BUSY), the latch circuit 40 latches the high-level of the level signal VCCLVLpre, and outputs this high level as the level signal VCCLVL. In this way, the level signal VCCLVLpre and the state signal COM are inputted to the latch circuit 40, and the latch circuit 40 latches the level signal VCCLVLpre at the time when the state signal COM becomes high (BUSY), and outputs that signal level as the level signal VCCLVL.

Figure 5:
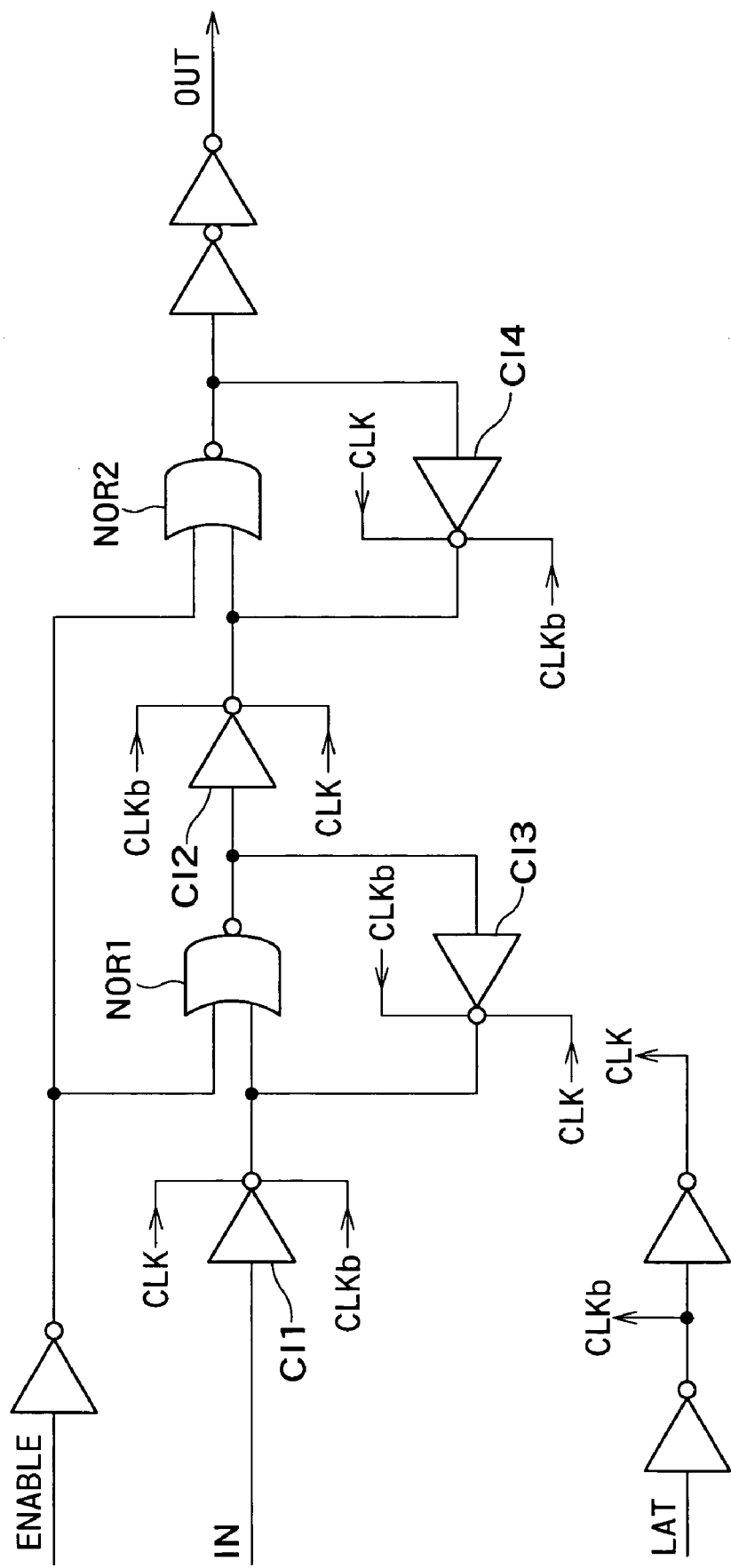
FIG. 5 is a circuit diagram of the latch circuit 40.
Figure 6:
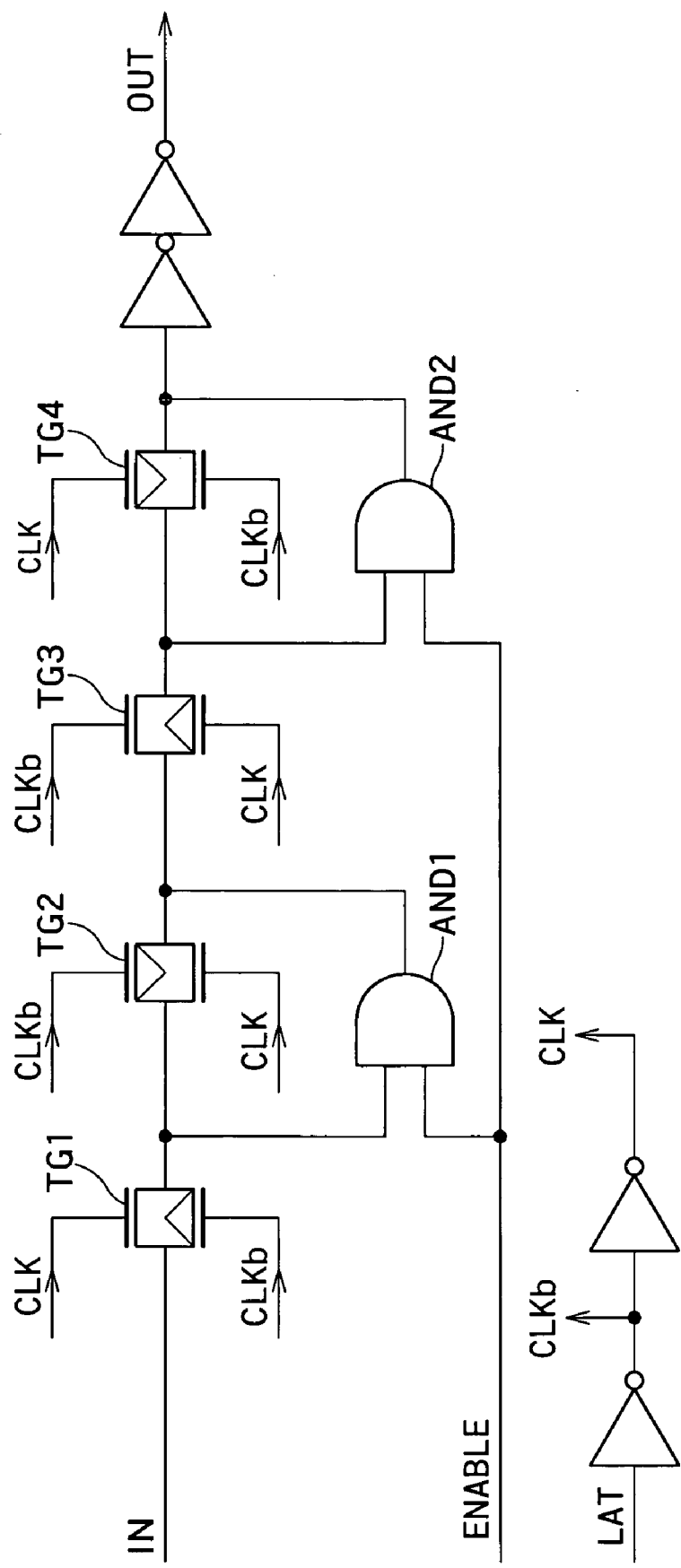
FIG. 6 is a circuit diagram of the latch circuit 40.

PWONRSTb is a signal inputted so that the signal level of the level signal VCCLVL does not become unstable when the power source is initially turned on. In the embodiments of FIGS. 5 and 6 that are described hereinafter, after the power source is turned on, PWONRSTb once becomes low, therefore the latch circuit 40 is reset, and thereafter, PWONRSTb is maintained at high.

FIGS. 5 and 6 are circuit diagrams showing the structure of the latch circuit 40. The latch circuit 40 may be either structure shown in FIGS. 5 or 6. The latch circuit 40 shown in FIG. 5 comprises clocked inverters CI1 to CI4, and NOR gates NOR1, NOR2. The clocked inverter CI1 is connected between input terminal IN and one input terminal of the NOR gate NOR1. The clocked inverter CI2 is connected between an output terminal of the NOR gate NOR1 and one input terminal of the NOR gate NOR2. A inverted signal of PWONRSTb is inputted to the NOR gates NOR1, NOR2 from respective other input terminals thereof. The clocked inverter CI3 feeds-back between the output terminal and one input terminal of the NOR gate NOR1. The clocked inverter CI4 feeds-back between an output terminal and one input terminal of the NOR gate NOR2. An output signal of the NOR gate NOR2 is outputted from the latch circuit 40 as the level signal VCCLVL.

The latch circuit 40 shown in FIG. 6 comprises transfer gates TG1 to TG4, and AND gates AND1, AND2. The transfer gates TG1 to TG4 are connected in series between input terminal IN and output terminal OUT. Two inputs of the AND gate AND1 are connected to an output of the transfer gate TG1 and a terminal ENABLE, respectively. An output of the AND gate AND1 is connected between the transfer gates TG2 and TG3. Two inputs of the AND gate AND2 are connected to an output of the transfer gate TG3 and the terminal ENABLE. An output of the AND gate AND2 is connected to an output of the transfer gate TG4. An output signal of the transfer gate TG4 is outputted from the latch circuit 40 as the level signal VCCLVL.

In FIGS. 5 and 6, clocks CLK and CLKb, which are inputted to the clocked inverters CI1 to CI4, are respectively a non-inverted signal and an inverted signal of the state signal COM inputted from a latch terminal LAT.

The level signal VCCLVLpre is inputted to the latch circuits shown in FIGS. 5 and 6 from the input terminal IN, and the state signal COM is inputted from the input terminal LAT. These latch circuits latch the signal level of the level signal VCCLVLpre when the state signal COM becomes BUSY, and output this signal level as the level signal VCCLVL.

An example of flow of operations in the present embodiment, and effects of the present embodiment are set forth with reference to the timing charts of FIG. 7 to FIG. 10. FIG. 7 to FIG. 10 are respectively timing charts of the power supply voltage Vcc, the level signal VCCLVLpre, the state signal COM, and the level signal VCCLVL.

As shown in FIG. 9, at time t0, the state signal COM rises to high (BUSY). At this time, the level circuit 40 latches the signal level of the level signal VCCLVLpre. At time t1, because the power supply voltage Vcc is less than or equal to the first threshold voltage (2.1 V), the level signal VCCLVLpre is low. The latch circuit 40 latches the low level, and outputs the low level as the level signal VCCLVL.

After the state signal COM falls to low (READY) at time t2, the power supply voltage Vcc exceeds the second threshold voltage (2.3 V) at time t3. The level signal VCCLVLpre thereby becomes high. However, because the state signal COM remains low (READY) as is, the level signal VCCLVL is maintained low.

When the state signal COM rises to high (BUSY) at time t4, because the signal level of the level signal VCCLVLpre is high, the latch circuit 40 latches the high level and outputs the high level as the level signal VCCLVL.

Provided that the state signal COM does not rise from low (READY) to high (BUSY), the latched state of the level signal VCCLVL is maintained even if noise N or momentary service interruption B arises. For example, at time t5 to t6, if the noise N that is lower than the second threshold value (2.3 V) arises, the signal level of the level signal VCCLVL is maintained because the latch circuit 24 of FIG. 4 maintains the signal level of the level signal VCCLVLpre. At time t8 to t9, if a momentary service interruption that is lower than the first threshold value (2.1 V) arises, the latch circuit 24 cannot maintain the signal level of the level signal VCCLVLpre. However, because the state signal COM at this time is maintained high (BUSY), the latch circuit 40 maintains the signal level of the level signal VCCLVL. Accordingly, during the time t4 to t11, the level signal VCCLVL maintains the signal level without being affected by the noise N or the momentary service interruption B.

Thereafter, at time t11, when the state signal COM rises from low (READY) to high (BUSY), the latch circuit 40 latches the signal level (low) of the level signal VCCLVLpre, and outputs this signal level as the level signal VCCLVL. The present embodiment operates as described above.

According to the present embodiment, at the time when the state signal COM becomes high (BUSY), the latch circuit 40 latches the signal level of the level signal VCCLVLpre, and maintains this signal level until the state signal COM becomes low (READY). Accordingly, even if the power supply voltage fluctuates due to noise or a momentary service interruption or the like during operation, the circuit operation of the booster 12 controlled by the level signal VCCLVL does not change, and stable operation is maintained. Therefore, the internal circuits of the semiconductor memory device 100 are not broken down. Further, it suffices for the latch circuit 40 of the present embodiment to raise the state signal COM to high (BUSY) in order to cancel the latch state, therefore there is no need to turn the power off. Accordingly, in the present embodiment, the circuit operation of the booster 112 can be changed smoothly according to changing in the range of the power supply voltage. For example, at the booster 112, if the power supply voltage Vcc is a low voltage level, the voltage converting circuits VA1 to VAm boost the clocks Φ and Φ bar by a relatively high boosting ability, and if the power supply voltage Vcc transits to a high voltage level, the voltage converting circuits VA1 to VAm can smoothly transit so as to boost the voltage by a relatively low boosting ability.

In the first embodiment, the power supply voltage Vcc is dual-range voltage, but the same holds even if the power supply voltage Vcc is wide-range voltage. For example, the first embodiment can be applied even if the power supply voltage Vcc has a wide voltage range of 1.65 V to 3.6 V.

(Second Embodiment)

Figure 11:
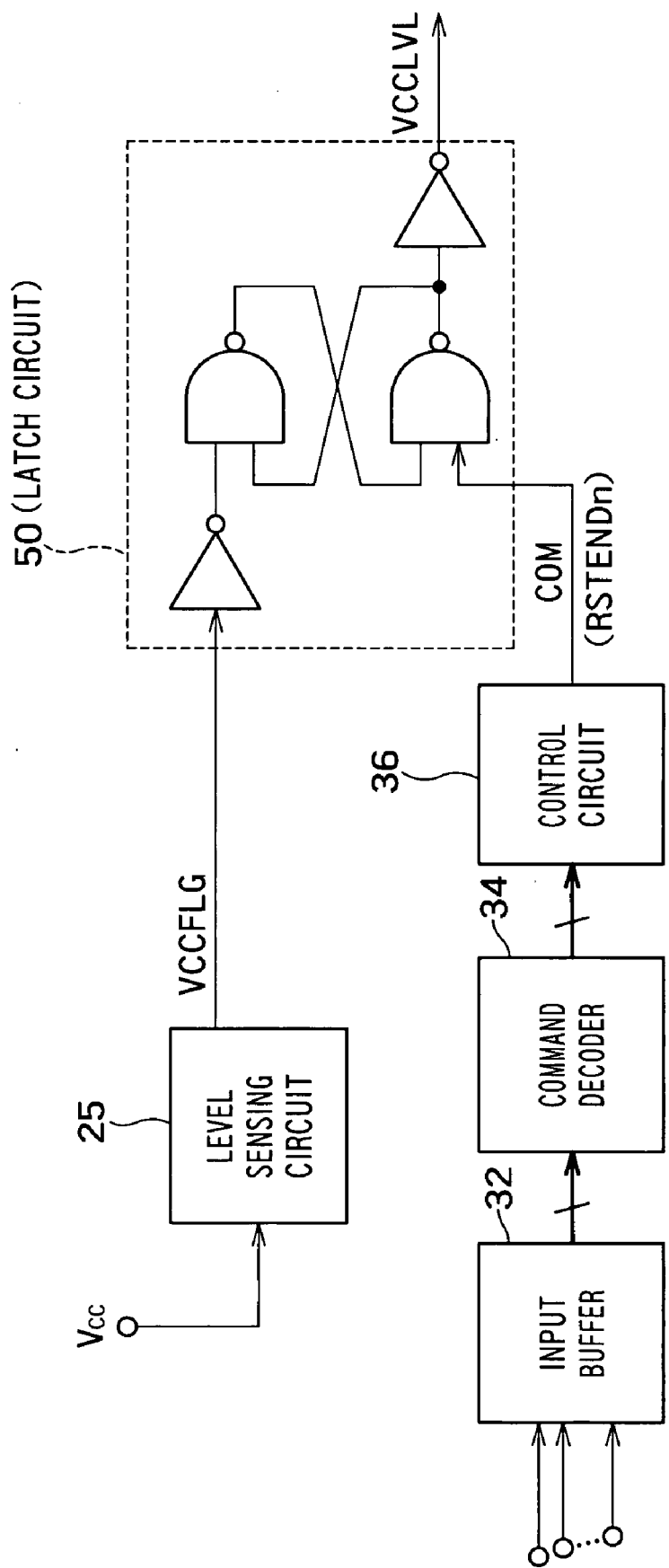
FIG. 11 is a structural diagram of the level sensing circuit 25, the input buffer 32, the command decoder 34, the control circuit 36, and the latch circuit 50 according to the second embodiment of the present invention.

FIG. 11 is a structural diagram of the level detector 20, the input buffer 32, the command decoder 34, the control circuit 36, and the latch circuit 40 according to the second embodiment of the present invention. The second embodiment differs from the first embodiment with respect to the structures of the level detector 20 and the latch circuit 40. Other structures of the second embodiment may be similar to those of the first embodiment shown in FIG. 1 through FIG. 3.

In the first embodiment, the latching function is realized by the plural latch circuits 24, 40, but in the second embodiment, the latching function is realized by one latch circuit 50. Further, in the first embodiment, the BUSY signal showing that the semiconductor device 100 is in a state of operating (BUSY) is used as the state signal COM. However, in the second embodiment, a reset end signal RSTENDn is used as the state signal COM.

When the power supply voltage Vcc is a low voltage range, a level sensing circuit 25 outputs low as a flag signal VCCFLG. When the power supply voltage Vcc is in a high voltage range, the level sensing circuit 25 outputs high as the flag signal VCCFLG. More specifically, the flag signal VCCFLG transits from low to high when the power supply voltage Vcc exceeds 2.3 V, and transits from high to low when the power supply voltage Vcc falls below 2.3 V. Namely, the level sensing circuit 25 has only one threshold voltage, and the flag signal VCCFLG does not have hysteresis with respect to the power supply voltage.

In order to operate the memory unit and the peripheral circuits thereof 10, the control circuit 36 usually outputs the reset end signal RSTENDn, in addition to the BUSY signal. In the second embodiment, the BUSY signal is supplied to the memory unit and the peripheral circuits thereof 10, but is not supplied to the latch circuit 50.

The reset end signal RSTENDn is a signal that expresses a end-point of a series of resetting operations used to end the operations of the memory unit and the peripheral circuits thereof 10 in the midst of the operations, or used to initialize the memory unit and the peripheral circuits thereof 10. The reset end signal RSTENDn is outputted at the end of a reset operation that is started by a command or the like inputted from the exterior. During operation of the semiconductor memory device 100, the reset end signal RSTENDn is usually in a high state, and at the end-point of the resetting operation, the reset end signal RSTENDn temporarily becomes low and ends the resetting operation (see FIG. 15).

In the period of time of the series of resetting operations (hereinafter also called resetting sequence), initialization operation of the memory unit and the peripheral circuits thereof 10 is carried out and the memory unit and the peripheral circuits thereof 10 are in a BUSY state. The resetting sequence is executed at times t21 to t22, t26 to t27, and t36 to t37 in FIGS. 14 and 15. The end-point of the reset end signal RSTENDn is the time of the rise of the signal shown by arrow E in FIG. 15. Hereinafter, the end-point of the reset end signal RSTENDn is called reset end E.

The reset signal RSTENDn is inputted to the latch circuit 50 as a control signal, and on the basis of the reset signal RSTENDn, the latch circuit 50 latches the signal level of the flag signal VCCFLG. The latch circuit 50 outputs the latched signal level as level signal VCCLVL.

Figure 16:
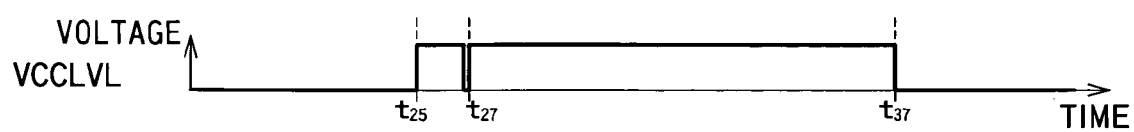
FIG. 16 is a timing chart of the level signal VCCLVL.

At the time when the reset signal RSTENDn is high, when the flag signal VCCFLG transits from low to high, the level signal VCCLVL also changes from low to high as shown by time t25 in FIG. 16. Here, the time of the reset end E is unrelated. On the other hand, when the reset signal RSTENDn is high, even if the flag signal VCCFLG transits from high to low as shown by times t29 to t30, t31 to t32, and t35 in F*ig.* 13, the level signal VCCLVL does not transit from high to low. At the time of the reset end E (time t37), the latch circuit 50 latches the flag signal VCCFLG, and the level signal VCCLVL at this time transits from high to low.

An example of flow of operations in the second embodiment, and effects of the second embodiment are set forth with reference to the timing charts of FIG. 12 to FIG. 16. FIG. 12 to FIG. 16 are respectively timing charts of the power supply voltage Vcc, the flag signal VCCFLG, the state signal BUSY, the reset end signal RSTENDn, and the level signal VCCLVL.

Figure 14:
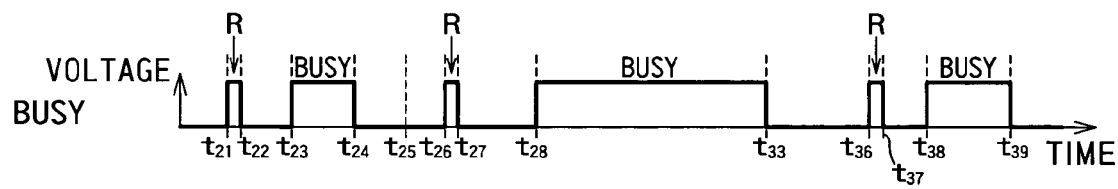
FIG. 14 is a timing chart of the state signal BUSY/READY.
Figure 15:
FIG. 15 is a timing chart of the reset end signal RSTENDn.

As shown in FIGS. 14 and 15, the semiconductor device receives a reset command for initialization after the start-up of power, and enters into the resetting sequence at time t21, and at reset end E, the latch circuit 50 latches the flag signal VCCFLG. At this time, because the flag signal VCCFLG is low, the latch circuit 50 maintains low as the level signal VCCLVL.

Figure 12:
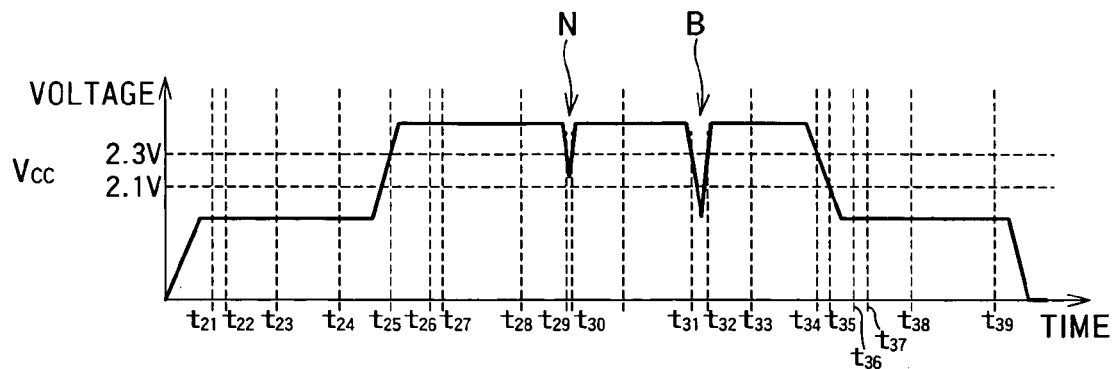
FIG. 12 is a timing chart of the power supply voltage Vcc.
Figure 13:
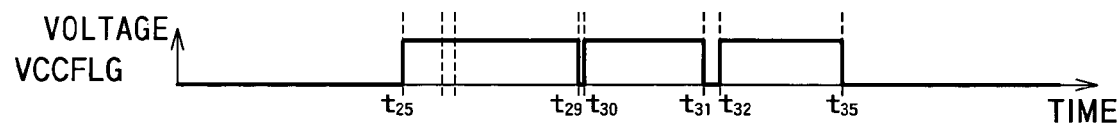
FIG. 13 is a timing chart of the flag signal VCCFLG.

As shown in FIGS. 12 and 13, at time t25, the power supply voltage Vcc exceeds the second threshold voltage (2.3 V). Therefore, the flag signal VCCFLG transits from low to high. At this time, as shown in FIGS. 15 and 16, because the reset end signal RSTENDn is high, the level signal VCCLVL transits from low to high according to the flag signal VCCFLG.

At time t26 to t27, the resetting sequence is executed. At this time, the level signal VCCLVL temporarily becomes low synchronously with the reset end signal RSTENDn, but at timing t27 of the reset end E, the flag signal VCCFLG is latched appropriately and the level signal VCCLVL becomes high.

As shown in FIG. 12, at times t29 to t30 and t31 to t32, the noise N and the momentary service interruption B occur. Because the noise N and the momentary service interruption B are lower than the threshold voltage (2.3 V), the flag signal VCCFLG transits from high to low.

However, as shown in FIG. 16, the level signal VCCLVL does not change. This is because the resetting sequence is not executed, and the latch circuit 50 is latching the high.

As shown in FIGS. 12 and 13, when the power supply voltage Vcc falls below the threshold voltage (2.3 V) at time t34, the flag signal VCCFLG transits from high to low. At this time, because the resetting sequence is not executed, the latch circuit 50 continues to latch high as the level signal VCCLVL as shown in FIG. 16.

When the resetting sequence is executed at time t36 to t37, at the rise time t37 of the reset end E, the level signal VCCLVL transits from high to low according to the flag signal VCCFLG. The second embodiment operates in this way.

According to the second embodiment, the signal level of the level signal VCCLVL changes from high to low only at the time of the reset end signal RSTENDn, and does not change at other times. Accordingly, in the semiconductor memory device according to the second embodiment, even if the power supply voltage drops momentarily due to noise or a momentary service interruption or the like when the power supply voltage Vcc is in a high voltage range, the circuit operation of the booster 112 that is controlled by the level signal VCCLVL does not change, and stable boosting operation can be maintained. As a result, the internal circuits of the semiconductor memory device are not broken down. Further, in the latch circuit 50 of the second embodiment, the latched state of the level signal VCCLVL at high level is cancelled by the reset end signal RSTENDn that comes into effect at the end of the resetting sequence started by input of the reset command. The boosting operations of the voltage converting circuits VA1 to VAm can thereby be changed smoothly according to the change in the range of the power supply voltage, without turning the power off once.

In the second embodiment, the power supply voltage Vcc is dual range, but the power supply voltage Vcc may be wide range.

What is claimed is:

1. A semiconductor device comprising:
    an electrical circuit formed on a substrate;
    a level detector outputting a first level signal which has a signal level based on a power supply voltage and which determines an operation of the electrical circuit;
    a command decoder decoding a command that is inputted from the outside, and outputting a command signal;
    a control circuit to which the command signal is inputted, the control circuit outputting a state signal expressing whether the electrical circuit is in an operation state; and
    a first latch circuit to which the first level signal and the state signal are inputted, the first latch circuit latching the first level signal at a time based on the state signal.

2. The semiconductor device according to claim 1, wherein the electrical circuit includes a non-volatile memory device and a peripheral circuit driving the non-volatile memory device.

3. The semiconductor device according to claim 2, wherein the first latch circuit latches the first level signal, and outputs a second level signal based on the first level signal, the second level signal changes an operation of the peripheral circuit, the state signal is a signal indicating whether the peripheral circuit is in the operation state or not.

4. The semiconductor device according to claim 3, wherein the command is any one of a command for reading data from the non-volatile memory device, a command for writing data to the non-volatile memory device or a command for erasing data in the non-volatile memory device.

5. The semiconductor device according to claim 2, wherein the command is any one of a command for reading data from the non-volatile memory device, a command for writing data to the non-volatile memory device or a command for erasing data in the non-volatile memory device.

6. The semiconductor device according to claim 2, wherein the operation of the electrical circuit is an operation boosting the power supply voltage to read data from the non-volatile memory device, to write data to the non-volatile memory device or to erase data in the non-volatile memory device.

7. The semiconductor device according to claim 1, wherein a range of the power supply voltage, in which the operation of the semiconductor device is ensured, consists of a plurality of voltage ranges different from each other or consists of a single wide range including the plurality of voltage ranges.

8. The semiconductor device according to claim 1, wherein the level detector comprises a level sensing unit outputting a first flag signal and a second flag signal, the first flag signal indicating that the power supply voltage surpasses a first threshold, the second flag signal indicating that the power supply voltage surpasses a second threshold higher than the first threshold; wherein the level detector further comprises a second latch circuit which latches, when both signal levels of the first and the second flag signals make transition, the signal levels as the first level signal.

9. The semiconductor device according to claim 8, wherein the state signal is a busy signal changing the semiconductor device to the operation state.

10. The semiconductor device according to claim 1, wherein the state signal is a busy signal changing the semiconductor device to the operation state.

11. The semiconductor device according to claim 1, wherein the level detector outputs a flag signal making transition when the power supply voltage surpasses a first threshold or when the power supply voltage is lower than the first threshold, wherein the first latch circuit latches the first level signal at the time when the flag signal makes transition in a case that the power supply voltage surpasses the first threshold, and latches the first level signal at the time based on the state signal in a case that the power supply voltage is lower than the first threshold.

12. The semiconductor device according to claim 11, wherein the state signal is a reset signal supplied to the latch circuit in a case of initializing the semiconductor device by a reset command inputted from the outside.

13. The semiconductor device according to claim 1, wherein the state signal is a reset signal supplied to the latch circuit in a case of initializing the semiconductor device by a reset command inputted from the outside.

* * * * *